(12) United States Patent
Oh (10) Patent No.: US 7,764,112 B2
(45) Date of Patent: Jul. 27, 2010

(54) INTERNAL VOLTAGE DISCHARGE CIRCUIT AND ITS CONTROL METHOD

(75) Inventor: Seung-Min Oh, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 49 days.

(21) Appl. No.: 12/323,308

(22) Filed: Nov. 25, 2008

(65) Prior Publication Data

US 2009/0278592 A1     Nov. 12, 2009

(30) Foreign Application Priority Data

May 9, 2008     (KR) ...................... 10-2008-0043263

(51) Int. Cl.
*G05F 1/10*     (2006.01)
(52) U.S. Cl. .................................... 327/540
(58) Field of Classification Search ................ 327/534, 327/535, 537, 540, 541
See application file for complete search history.

(56) References Cited

U.S. PATENT DOCUMENTS

| | | | |
|---|---|---|---|
| 5,892,386 A | 4/1999 | Lee et al. | |
| 6,377,033 B2 * | 4/2002 | Hsu ........................... | 323/274 |
| 6,867,641 B2 | 3/2005 | Kang et al. | |
| 6,947,347 B2 | 9/2005 | Fujioka | |
| 6,958,947 B2 | 10/2005 | Park et al. | |
| 7,221,213 B2 * | 5/2007 | Lee et al. ..................... | 327/541 |
| 2004/0001385 A1 | 1/2004 | Kang | |
| 2006/0002222 A1 | 1/2006 | Lee | |

FOREIGN PATENT DOCUMENTS

| | | |
|---|---|---|
| JP | 08-147998 | 6/1996 |
| JP | 10-125097 | 5/1998 |
| JP | 2003-085977 | 3/2003 |
| KR | 1020030097024 A | 12/2003 |
| KR | 1020050070279 A | 7/2005 |

OTHER PUBLICATIONS

Notice of Allowance issued from Korean Intellectual Property Office on Oct. 30, 2009.

* cited by examiner

*Primary Examiner*—Jeffrey S Zweizig
(74) *Attorney, Agent, or Firm*—IP & T Law Firm PLC (57) ABSTRACT

An internal voltage discharge circuit includes a differential comparator for differentially comparing a reference voltage with a feedback voltage to generate a discharge control voltage, a level detector for detecting a level of external power supply voltage and a discharge unit for adjusting an amount of discharge of an internal voltage based on the level signal detected by the level detector and the discharge control voltage from the differential comparator.

22 Claims, 8 Drawing Sheets

|  | HVDD | LVDD |
|---|---|---|
| LOW VDD | L | H |
| NORMAL VDD | L | L |
| HIGH VDD | H | L |

INTERNAL VOLTAGE DISCHARGE CIRCUIT AND ITS CONTROL METHOD

CROSS-REFERENCE TO RELATED APPLICATION

The present invention claims priority from Korean patent application number 10-2008-0043263, filed on May 9, 2008, which is incorporated by reference in its entirety.

BACKGROUND OF THE INVENTION

The present invention relates to a semiconductor memory device, and more particularly, to an internal voltage discharge circuit capable of efficiently adjusting a discharge amount of internal voltage depending on a potential of external power supply voltage applied to the memory device, and its control method.

In general, a semiconductor memory device generates a power supply voltage having a level as needed, from an external power supply voltage having less than a certain level, for its use therein. For a memory device with a bit line sense amplifier such as DRAM, a core voltage VCORE is used to amplify cell data. When word lines are activated, data in plural memory cells coupled to the word lines are conveyed to a pair of bit lines. Then, the bit line sense amplifier senses and amplifies a voltage difference between the pair of bit lines.

In this manner, the DRAM uses the core voltage, and is provided with an internal driver, i.e., a core voltage driver for generating a core voltage level. By the way, as the DRAM operates at a high speed more and more, cells should also operate at a high speed and thus a core voltage level of cells also needs fast charging capability. Here, the charging means that data (voltage) loads on a capacitor within the DRAM.

Thus, an overdriving method has been used to generate a core voltage level at an external power supply voltage VDD level that is a higher potential than it, and amplify data at the core voltage level. Also, a release driver has been utilized to discharge the core voltage level in order to prevent the core voltage level from being kept in high state by such overdriving even after the overdriving operation.

As noted above, the voltages used for the semiconductor memory device are divided into the external power supply voltage and the internal voltage such as the core voltage generated by using the external power supply voltage. The internal voltage may easily vary by an internal operation of the semiconductor memory device. Particularly, there may be a possibility that the internal voltage contacts with a voltage having a higher level than its own voltage level, or if two or more voltages share the same node, there may be a difference between values of the shared voltages and a preset voltage. This phenomenon may frequently occur between the external power supply voltage and the core voltage in operation of the semiconductor memory device.

Figure 1:
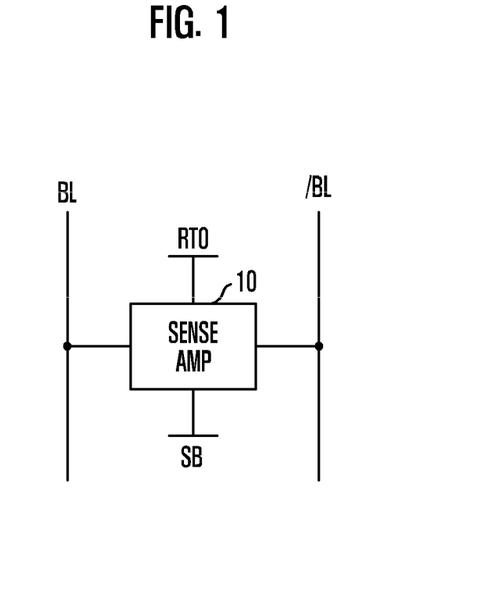
FIGS. 1 to 3 are examples of an existing overdriving circuit for a core voltage control circuit.
Figure 2:
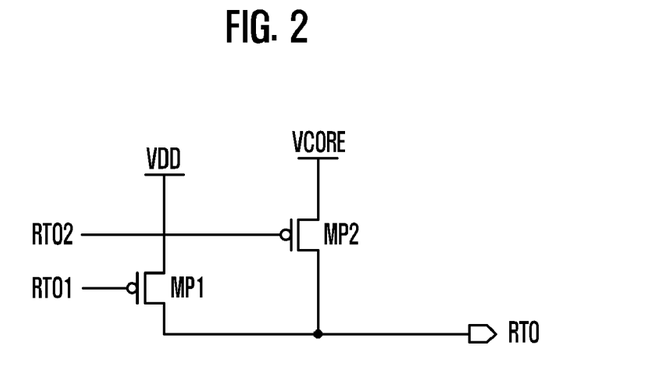
Figure 3:
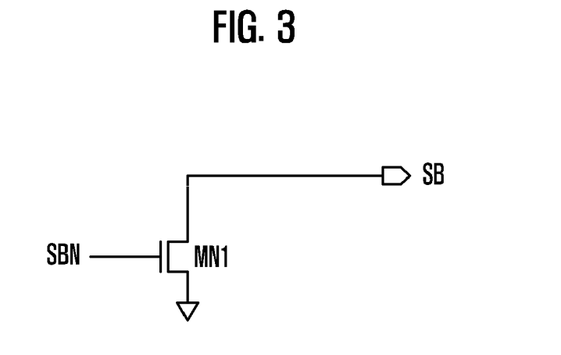

FIG. 1 is a diagram showing a general sense amplifier, and FIGS. 2 and 3 are circuit diagrams showing a controller for a sense amplifier power line.

Referring to FIGS. 1 to 3, the sense amplifier 10 uses power supply voltages RTO and SB to sense and amplify a level difference of both bit lines BL and /BL. For sensing operation, a core voltage VCORE should be applied to an RTO terminal, while a ground voltage VSS should be applied to an SB terminal.

Figure 4:
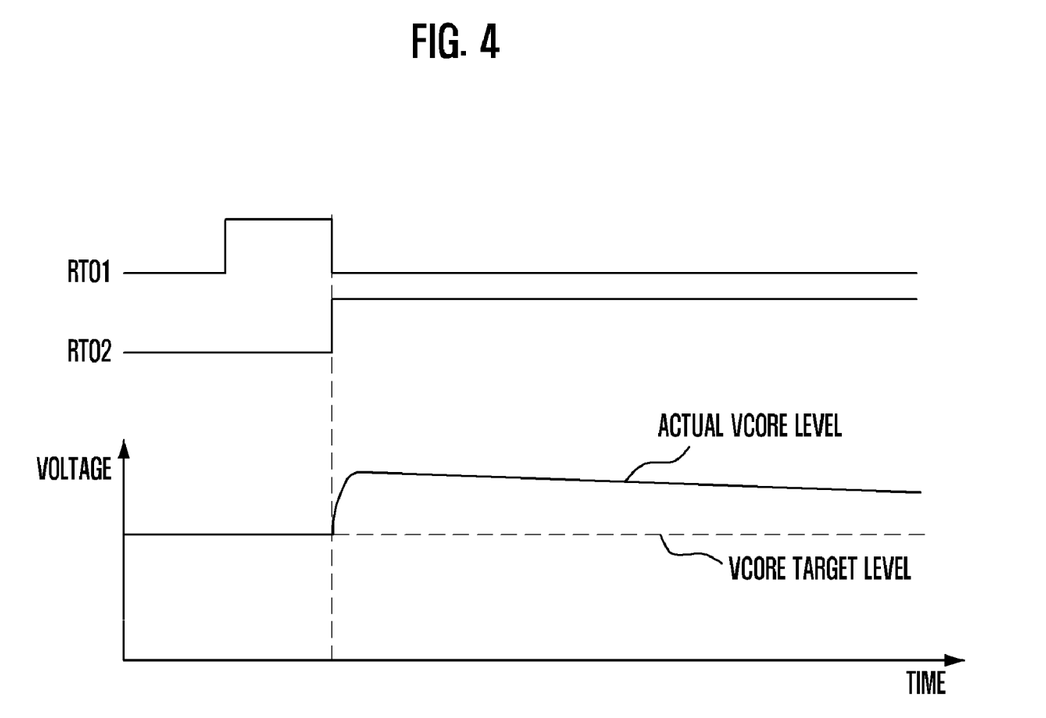
FIG. 4 is a waveform diagram showing that a core voltage rises under an overdriving control.

In order that the semiconductor memory device has good operation characteristics tRCD by fast sensing, an external power supply voltage VDD is applied to the RTO terminal during a high pulse interval of an RT01 signal as shown in FIG. 4. That is, when the RTO1 signal is at logic high level, a PMOS transistor MP1 is turned on, thereby supplying the external power supply voltage VDD to the RTO terminal.

On the other hand, when the RTO1 signal becomes a logic low level, the PMOS transistor MP1 is turned off, thereby preventing the external power supply voltage VDD from being supplied to the RTO terminal. At this time, an RTO2 signal is also enabled to a logic high level and thus the PMOS transistor MP2 is turned on, thereby changing the power supply voltage applied to the RTO terminal from the external power supply voltage VDD to the core voltage VCORE.

For this operation, a core voltage overdriving circuit is configured such that the RTO node rising to the VDD level during an overdriving interval is coupled to the core voltage VCORE to bypass current to the VCORE node, so that the VCORE level rises.

That is, the core voltage level rises due to current inflow by the external power supply voltage VDD applied to the RTO terminal during the overdrive interval, as shown in FIG. 4. At this time, the core voltage level becomes higher than a target voltage, and thus there is a need for the control of discharging the raised core voltage level so as to return it to a predetermined target core voltage level.

Figure 5:
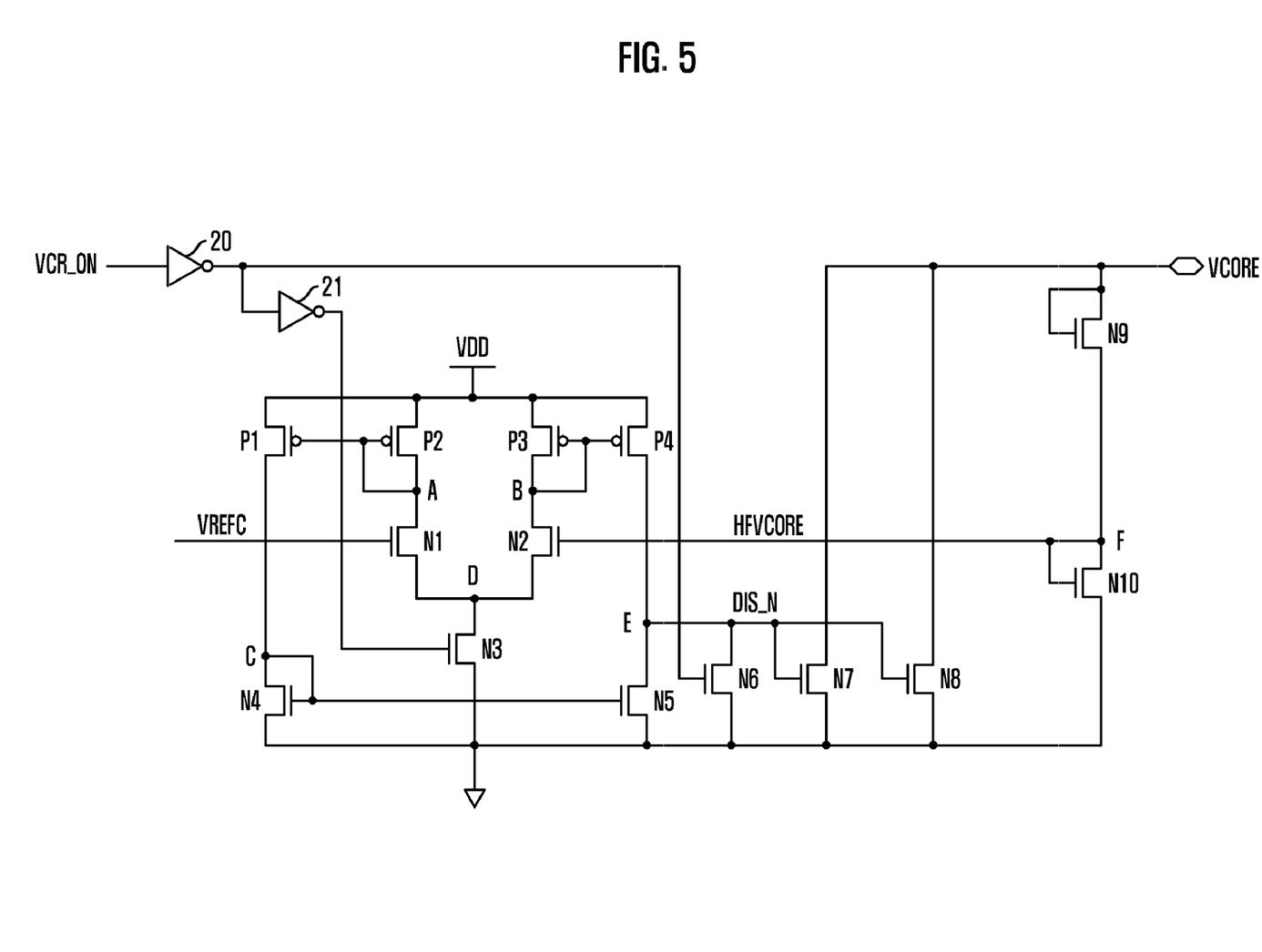
FIG. 5 is a general internal voltage discharge circuit.

FIG. 5 is an existing internal voltage discharge circuit to return a core voltage that was higher than a target level to a target level by its discharging.

In the existing internal voltage discharge circuit, a drive point of time is determined by an enable signal VCR_ON that has a logic high level in synchronism with a falling edge of the RTO1 signal. Such an internal voltage discharge circuit operates during an interval where the enable signal is at a logic high level, wherein the operation interval has about several tens of nanoseconds.

The existing internal voltage discharge circuit is configured in a manner that a reference voltage VREFC for generating a core voltage is coupled to an NMOS transistor N1 located at an input end of a differential comparator and a feedback voltage VCORE/2 (HFVCORE) is coupled to an NMOS transistor N2 located at another input end of the differential comparator. By this configuration, the core voltage level can be kept at a stable level twice the internal reference voltage VREFC.

Thus, when the enable signal VCR_ON becomes a logic high level, a high level signal is applied to a gate of an NMOS transistor N3 to control the differential comparator to be operable. The differential comparator serves to compare the feedback voltage having a level of VCORE/2 voltage-divided by transistors N9 and N10 having diode characteristics with the reference voltage.

However, in case where the level of the core voltage end rises over the target level by the overdriving control method as shown in FIG. 4, the feedback voltage has a higher potential than the reference voltage. At this time, more current flows through the NMOS transistor N2, so that the electric potential of the node B drops.

As the electric potential of the node B is decreased, the gate voltage of a PMOS transistor P4 is also decreased. This increases a drive force of the PMOS transistor P4, which raises the electric potential of the node E. And the raised voltage of the node E turns on discharge transistors N7 and N8, thereby discharging the core voltage.

Meanwhile, the internal voltage discharge circuit is affected by the level of the external power supply voltage during the overdriving control process, as shown in FIGS. 2 and 3.

Figure 6:
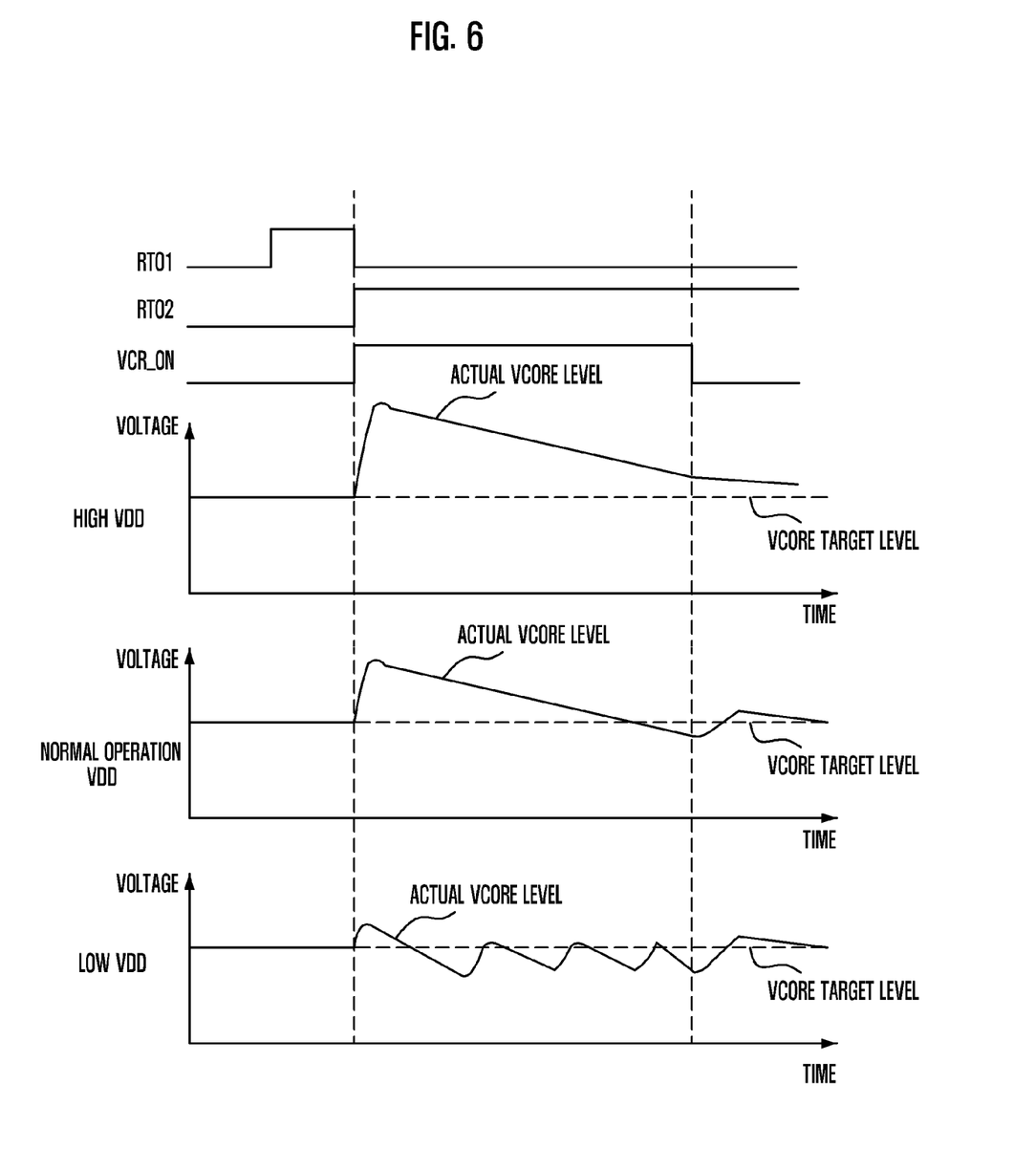
FIG. 6 is a diagram showing level variation of a core voltage when the core voltage is discharged depending on a level of external power supply voltage according to the prior art.

FIG. 6 is a diagram showing characteristics in which the amount of external power supply voltage VDD applied to a core voltage end varies depending on a level of the external power supply voltage VDD. When the external power supply voltage VDD is in a high level (HIGH VDD) state, more current flows to further raise the potential of the core voltage, compared to when it is at a normal level. On the other hand, when the external power supply voltage VDD is in a low level (LOW VDD) state, a relatively small current flows which lets the potential of the core voltage rise less, compared to when it is at a normal level.

Although the potential of the core voltage varies depending on the level of the external power supply voltage, the amount of discharge of the core voltage does not vary in a remarkable way. This is because the discharge transistors N7 and N8 operate regardless of level variation of the external power supply voltage. Therefore, when the external power supply voltage is at a logic high level HIGH VDD, a discharge amount by the discharge transistors is nothing but very small. Thus, much time is taken to let the core voltage drop to a target level, so that a sufficient discharge cannot occur. On the contrary, when the external power supply voltage is at a logic low level LOW VDD, a sufficient amount of discharge has been already made, but such a discharge operation is continuously performed, thereby rendering the core voltage lower than the target level. That is, since the conventional internal voltage discharge circuit does not efficiently use current, it increases current consumption.

SUMMARY OF THE INVENTION

Embodiments of the present invention are directed to providing an internal voltage discharge circuit capable of adjusting an amount of discharge of an internal voltage as needed depending on a potential of external power supply voltage applied to the memory device, and its control method.

In accordance with an aspect of the invention, an internal voltage discharge circuit includes a differential comparator for differentially comparing a reference voltage with a feedback voltage to generate a discharge control voltage, a level detector for detecting a level of external power supply voltage and a discharge unit for adjusting an amount of discharge of an internal voltage based on the level signal detected by the level detector and the discharge control voltage output by the differential comparator.

In accordance with another aspect of the invention, an internal voltage discharge circuit comprising a differential comparator for differentially comparing a reference voltage with a feedback voltage to generate a discharge control voltage, a level detector for detecting a level of external power supply voltage, a discharge unit for controlling discharge of an internal voltage and a discharge adjustor for adjusting a discharge amount of the discharge unit based on the level signal detected by the level detector and the discharge control voltage output by the differential comparator.

DESCRIPTION OF SPECIFIC EMBODIMENTS

Hereinafter, an internal voltage discharge circuit and its control method in accordance with embodiments of the present invention will be described in detail with reference to the accompanying drawings.

Figure 7:
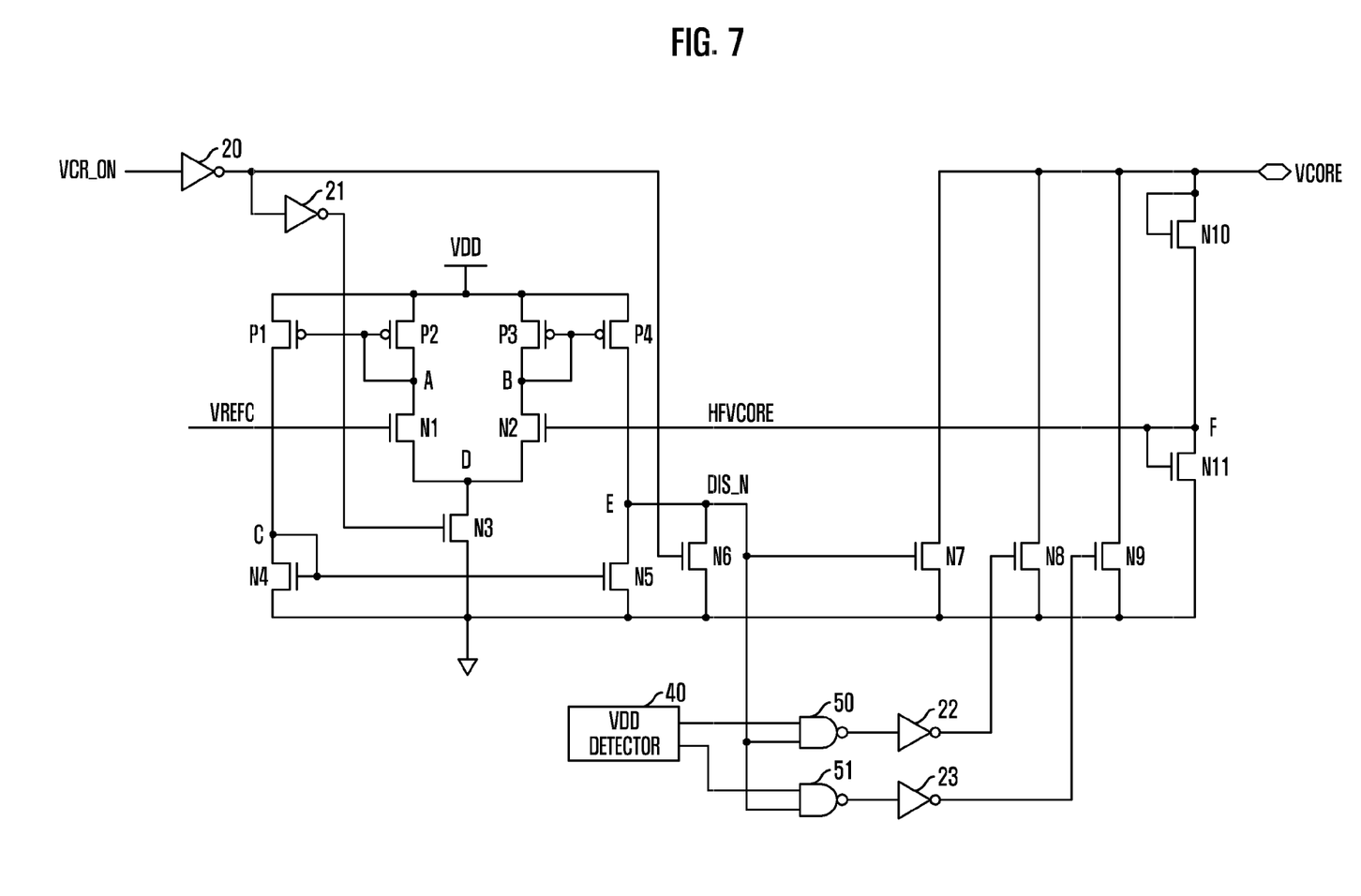
FIG. 7 is a circuit diagram illustrating an internal voltage discharge circuit in accordance with a first embodiment of the invention.

FIG. 7 is a circuit diagram illustrating an internal voltage discharge circuit in accordance with a first embodiment of the invention.

Referring to FIG. 7, the internal voltage discharge circuit of this embodiment includes a differential comparator for differentially comparing a feedback voltage consisting of a half core voltage having ½ level of an electric potential of a core voltage end with a reference voltage VREFC (e.g., 0.75 V that is ½ level of a target core voltage), a feedback voltage generator for voltage dividing a core voltage to be outputted, and generating the feedback voltage which is ½ level of an electric potential of the core voltage and to be used to sense the core voltage, and a control switch that is open or closed to form a current path of the differential comparator for its operation control.

In addition, the internal voltage discharge circuit of this embodiment further includes a discharge unit for discharging a core voltage when an electric potential of the core voltage is higher than a target level, and a discharge adjustor for adjusting an operation state of the discharge unit depending on a potential of an external power supply voltage.

More specifically, the differential comparator is composed of two NMOS transistors N1 and N2, which perform a differential comparison between a reference voltage VREFC provided from the outside and a feedback voltage having ½ level of a core voltage, sources of which are coupled to a node D. Therefore, the reference voltage VREFC is applied to a gate of the transistor N1, while the feedback voltage is inputted to a gate of the transistor N2.

Further, the transistor N1 has a drain coupled in series to a PMOS transistor P2 via a node A, in which the external power supply voltage VDD is applied to a source of the PMOS transistor P2. The PMOS transistor P2 and another PMOS transistor P1 are configured to have a current mirror structure that adjusts current of the node A.

Also, the transistor N2 constituting the differential comparator has a drain coupled in series to a PMOS transistor P3 via a node B, in which the external power supply voltage VDD is applied to a source of the PMOS transistor P3. The PMOS transistor P3 and another PMOS transistor P4 are configured to have a current mirror structure that serves to adjust current at the node B.

Further, coupled between the PMOS transistor P1 and a ground voltage is an NMOS transistor N4 and coupled between the PMOS transistor P4 and the ground voltage is an NMOS transistor N5. Also, the two NMOS transistors N4 and N5 are configured to have a current mirror structure.

The control switch is composed of an NMOS transistor N3 whose drain is coupled to the node D of the comparator, whose gate takes a discharge circuit enable signal VCR_ON from the outside, and whose source is coupled to the ground voltage.

The discharge enable signal VCR_ON has a logic high level in synchronism with a falling edge of the RTO0 signal. The internal voltage discharge circuit operates during an interval where the enable signal is at a logic high level, wherein the operation interval generally has about several tens of nanoseconds. The discharge circuit enable signal VCR_ON is applied to the gate of the NMOS transistor N3 via two inverters 20 and 21.

Also, the discharge circuit enable signal VCR_ON is inputted to the gate of the NMOS transistor N6 via the inverter 20. The NMOS transistor N6 is configured to selectively mute an output node E of the comparator. That is, when the discharge circuit enable signal VCR_ON is in enable state (logic high level), it is applied as a low signal to the gate of the NMOS transistor N6, which is turned off. On the contrary, when the discharge circuit enable signal VCR_ON is in disable state (logic low level), it is inputted as a high signal to the gate of the NMOS transistor N6. Thus, the NMOS transistor N6 is turned on, so that an electric potential of the node E becomes equal to the ground voltage.

The feedback voltage generator is composed of two NMOS transistors N10 and N11 coupled in series between an output terminal of the core voltage and the ground voltage. Coupled to a node F between the two transistors N10 and N11 is the gate of the transistor N2 of the comparator. The two transistors N10 and N11 are configured to have their gates coupled to their drains, respectively, so as to have diode characteristics. That is, the core voltage is divided by the two transistors N10 and N11. The core voltage so divided turns on the transistors N2 of the comparator.

The discharge unit of the invention includes an NMOS transistor N7 coupled to the output node E of the differential comparator and whose source is coupled to the ground voltage, whose gate is coupled to the output node E, and whose drain is coupled to a core voltage output terminal. Thus, an electric potential of the drain of the NMOS transistor N7 varies depending on a potential level of the output node E.

In addition, the discharge unit of the invention further includes NMOS transistors N8 and N9 coupled in parallel between the output node outputting the core voltage and the ground voltage. When the external power supply voltage is at a normal level, the NMOS transistor N8 operates together with the NMOS transistor N7, thereby controlling a discharge amount of the core voltage. On the other hand, when the external power supply voltage has a higher potential than a normal level, the NMOS transistor N9 operates together with the NMOS transistors N7 and N8, thereby controlling a discharge amount of the core voltage.

Also, the discharge unit of the invention further includes a detector 40 for detecting a level of the external power supply voltage, and an operation unit for adjusting operation states of the NMOS transistors N8 and N9 depending on a level value detected by the detector 40. The operation unit is provided with a first logic circuit for driving the NMOS transistor N8 when the external power supply voltage has a normal potential, and a second logic circuit for driving the NMOS transistor N9 when the external power supply voltage has a higher potential.

The first logic circuit is composed of a NAND gate 50 for performing a NAND operation on an output from the detector 40 and an output of the node E, and an inverter 22 for inverting an output from the NAND gate 50 to provide an inverted output to the gate of the NMOS transistor N8. Similarly, the second logic circuit is composed of a NAND gate 51 for executing a NAND operation on an output from the detector 40 and an output of the node E, and an inverter 23 for inverting an output from the NAND gate 51 to provide an inverted output to the gate of the NMOS transistor N9.

Now, an operation of the internal voltage discharge circuit in accordance with the invention having the configuration as above will be described in detail.

Figure 8:
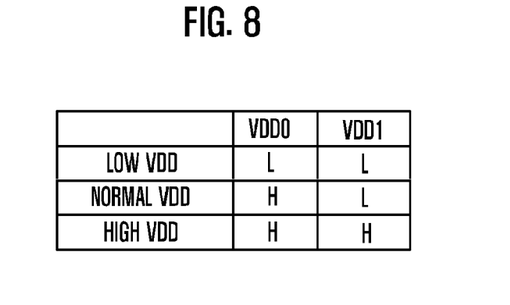
FIG. 8 is a state diagram showing states of signal outputs from the external power level detector in FIG. 7
Figure 9:
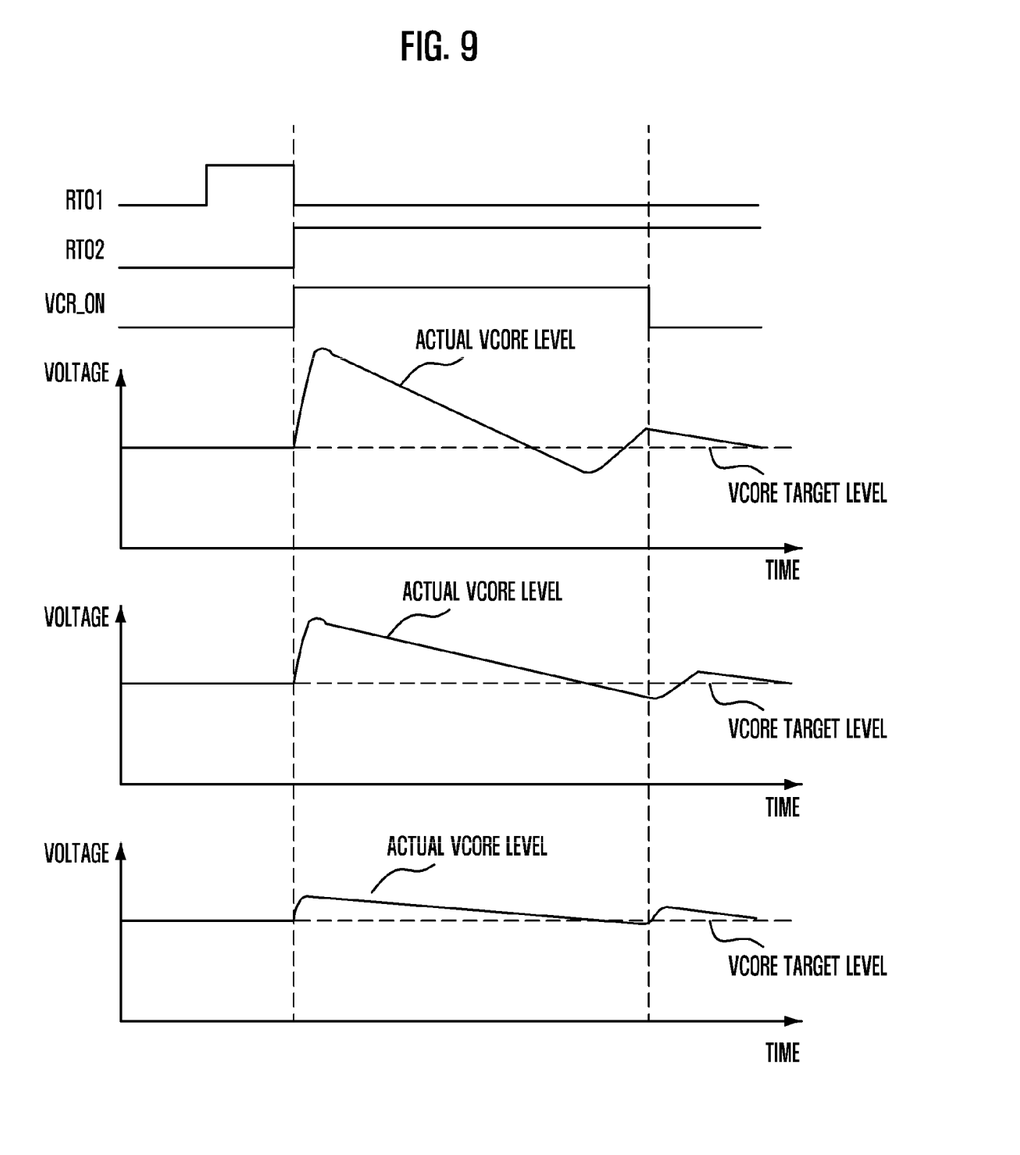
FIG. 9 is a diagram showing level variation of a core voltage when the core voltage is discharged depending on a level of external power supply voltage in accordance with the invention.

FIG. 8 is a state diagram showing states of signals outputted from the external power supply voltage detector in FIG. 7 depending on a potential of the external power supply voltage, and FIG. 9 is a diagram showing operation characteristics of the internal voltage discharge circuit in accordance with the invention.

First, when a discharge enable signal VCR_ON becomes a logic high level, the NMOS transistor N3 constituting the control switch is turned on to determine when the differential comparator will operate. At this time, the discharge enable signal VCR_ON is also applied as a low signal to the gate of the NMOS transistor N6, which makes the transistor N6 turned off.

The differential comparator compares a feedback voltage HFVCORE with a reference voltage VREFC, wherein the feedback voltage HFVCORE has a level of VCORE/2 voltage-divided by the transistors N10 and N11 having diode characteristics. When the core voltage end VCORE has a raised level during an overdriving control process, the feedback voltage has a higher potential than the reference voltage. At this time, more current flowing through the transistor N2 causes an electric potential of the node B to drop. The potential drop of the B node increases drive force of the PMOS transistor P4, so that an electric potential of the node E rises.

When the electric potential of the node E has risen, the transistor N7 is turned on to perform discharge of the core voltage.

Meanwhile, the detector 40, which detects the level of the external power supply voltage, outputs a different signal depending on the detected level. That is, when the external power supply voltage is at a normal level, the detector 40 outputs a first output VDD0 as a high signal and a second output VDD1 as a low signal. And when the external power supply voltage is at a logic low level, the detector 40 outputs both the first output VDD0 and the second output VDD1 as a low signal. On the contrary, when the external power supply voltage is at a logic high level, the detector 40 outputs both the first output VDD0 and the second output VDD1 as a high signal.

Thus, when the external power supply voltage is at a normal level, the detector 40 outputs a high signal and a low signal. Then, the NAND gate 50 performs a NAND operation on the high signal (first output) and the raised potential (high signal) of the node E to output a low signal. This low signal is inverted by the inverter 22 and then provided as a high signal to the gate of the discharge NMOS transistor N8.

Further, when the external power supply voltage is at a normal level, the NAND gate 51 executes a NAND operation on the low signal (second output) from the detector 40 and the raised potential (high signal) of the node E to output a high signal. This high signal is inverted by the inverter 23 and then delivered as a low signal to the gate of the discharge NMOS transistor N9.

Thus, when the external power supply voltage is at a normal level, the NMOS transistor N8 is turned on and the NMOS transistor N9 is turned off based on the outputs from the detector 40. That is, the core voltage is discharged under the control of the NMOS transistor N8 and the NMOS transistor N7 that has been already turned on.

Next, when the external power supply voltage is at a logic low level, the detector 40 outputs low signals via its two output terminals, respectively. Then, the NAND gate 50 performs a NAND operation on the low signal (first output) from the detector 40 and the raised potential (high signal) of the node E to output a high signal. This high signal is inverted by the inverter 22 and then provided as a low signal to the gate of the discharge NMOS transistor N8.

Similarly, the NAND gate 51 carries out a NAND operation on the low signal (second output) from the detector 40 and the raised potential (high signal) of the node E to output a high signal. This high signal is inverted by the inverter 23 and then forwarded as a low signal to the gate of the discharge NMOS transistor N9.

Thus, when the external power supply voltage is at a logic low level, both the NMOS transistors N8 and N9 are turned off based on the outputs from the detector 40. In this case, the core voltage is discharged only under the control of the NMOS transistor N7 that has been already turned on. That is, as shown in FIG. 9, the core voltage is less discharged, compared to when the external power supply voltage is at a normal level, thereby stably keeping a target core voltage level even at a low level of the external power supply voltage, without a reduction in level of the core voltage by its discharge.

On the contrary, when the external power supply voltage is at a logic high level, the detector 40 outputs high signals via its two output terminals, respectively. Then, the NAND gate 50 performs a NAND operation on the high signal (first output) from the detector 40 and the raised potential (high signal) of the node E to output a low signal. This low signal is inverted by the inverter 22 and then delivered as a high signal to the gate of the discharge NMOS transistor N8.

Similarly, the NAND gate 51 performs a NAND operation on the high signal (second output) from the detector 40 and the high potential (high signal) of the node E to output a low signal. This high signal is inverted by the inverter 23 and then provided as a low signal to the gate of the discharge NMOS transistor N9.

Thus, when the external power supply voltage is at a logic high level, the NMOS transistors N8 and N9 are all turned on based on the outputs from the detector 40. In this case, the core voltage is discharged while the two NMOS transistors N8 and N9 are discharged, together with the NMOS transistor N7 that has been already turned on. That is, as shown in FIG. 9, the core voltage is discharged a lot, compared to when the external power supply voltage is at a normal level, thereby making it possible to rapidly return to a target core voltage level.

As discussed earlier, in accordance with the invention, when the external power supply voltage is at a higher level than the normal level, a potential that has been an inflow from the external power supply voltage is sufficiently discharged during the overdriving control process. Thus, there is no phenomenon in which the core voltage level becomes higher than the target level. That is to say, the amount of inflowing current by the overdriving control varies depending on the level of the external power supply voltage, so that the invention allows the amount of current being discharged to vary.

Figure 10:
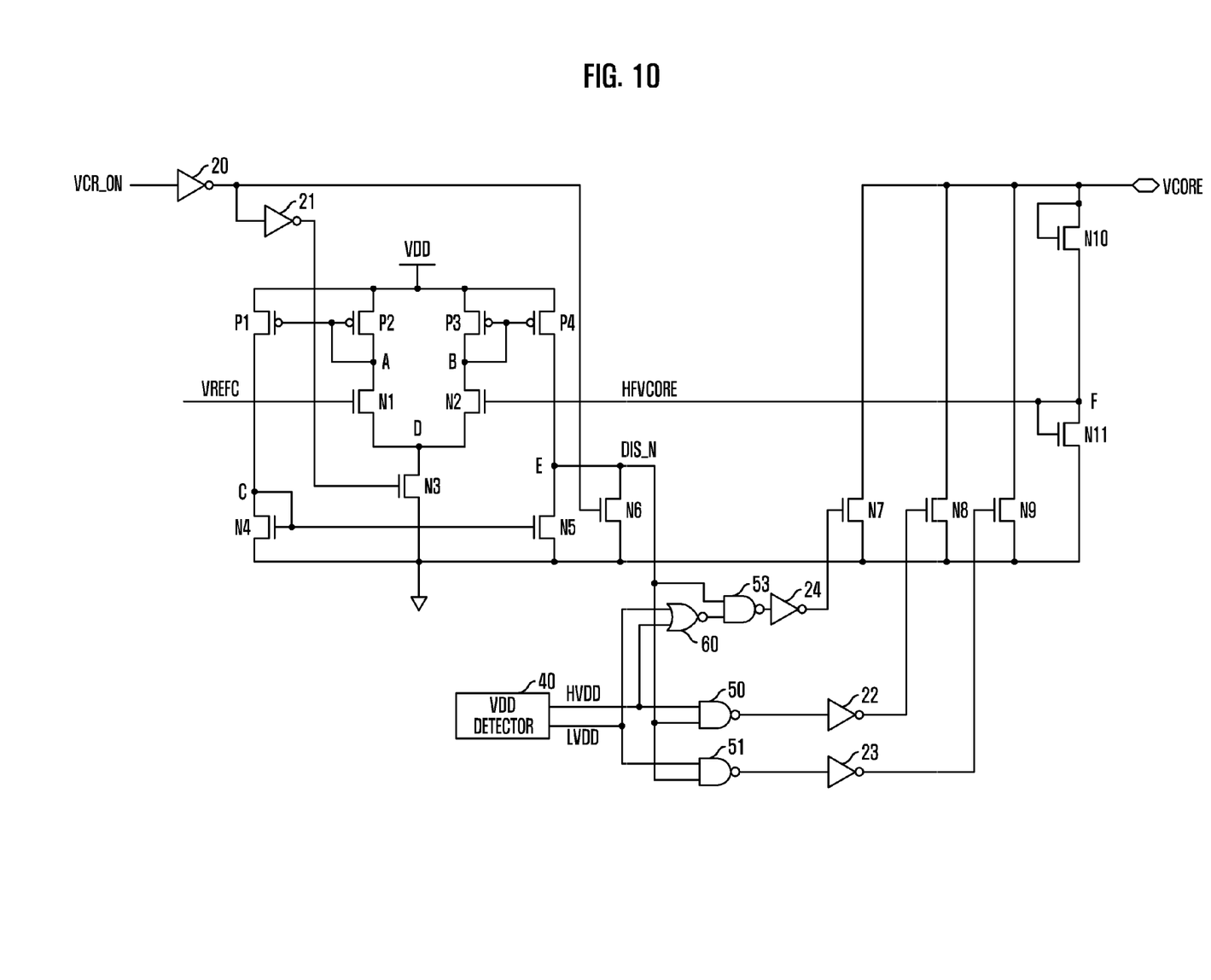
FIG. 10 is a circuit diagram illustrating an internal voltage discharge circuit in accordance with a second embodiment of the invention.

FIG. 10 is a circuit diagram showing an internal voltage discharge circuit in accordance with another embodiment of the invention.

In accordance with the embodiment illustrated, the invention includes a differential comparator for differentially comparing a feedback voltage which is a half core voltage having ½ level of the potential of the core voltage end with a reference voltage VREFC (e.g., 0.75 V that is ½ level of the target core voltage), a feedback voltage generator for voltage-dividing a core voltage to be outputted to generate the feedback voltage which is ½ level of potential of the core voltage end to be used to sense the core voltage, and a control switch which is open or closed to establish a current path of the comparator.

In addition, the invention further includes a discharge unit for discharging the core voltage when it has a higher potential than a target level. Moreover, the invention further includes a discharge adjustor for adjusting operation states of the discharge unit depending on a potential of the external power supply voltage.

The differential comparator is composed of two NMOS transistors N1 and N2, which perform a differential comparison on the reference voltage VREFC provided from the outside and the feedback voltage having ½ level of the core voltage, sources of which are commonly coupled a node D. Thus, the reference voltage VREFC is applied to a gate of the transistor N1, while the feedback voltage is inputted to a gate of the transistor N2.

Meanwhile, the transistor N1 has a drain coupled in series to a PMOS transistor P2 via a node A, in which the external power supply voltage VDD is applied to a source of the PMOS transistor P2. Also, the PMOS transistor P2 and another PMOS transistor P1 are configured to have a current mirror structure. This current mirror structure serves to adjust current of the node A.

Further, the transistor N2 constituting the comparator has a drain coupled in series to a PMOS transistor P3 via a node B, in which the external power supply voltage VDD is applied to a source of the PMOS transistor P3. Also, the PMOS transistor P3 and another PMOS transistor P4 are configured to have a current mirror structure. This current mirror structure adjusts current of the node B.

In addition, coupled between the PMOS transistor P1 and the ground voltage is an NMOS transistor N4, and coupled between the PMOS transistor P4 and the ground voltage is an NMOS transistor N5. These two NMOS transistors N4 and N5 are also configured to have a current mirror structure.

The control switch is composed of an NMOS transistor N3 whose drain is coupled to a node D of the comparator, gate takes a discharge circuit enable signal VCR_ON provided from the outside, and source is coupled to the ground voltage. The discharge circuit enable signal VCR_ON has a logic high level synchronized with a falling edge of the RTO1 signal. The internal voltage discharge circuit operates during an interval where the enable signal is at a logic high level, wherein the operation interval typically has about several tens of nanoseconds. The discharge circuit enable signal VCR_ON is applied to the gate of the NMOS transistor N3 via two inverters 20 and 21.

Also, the discharge circuit enable signal VCR_ON is inputted to a gate of the NMOS transistor N6 via the inverter 20. The NMOS transistor N6 is configured to selectively mute the output node E of the comparator. That is, when the discharge circuit enable signal VCR_ON is in enable state (high signal), it is applied as a low signal to the gate of NMOS transistor N6, which is turned off. On the contrary, when the discharge circuit enable signal VCR_ON is in disable state (low signal), it is inputted as a high signal to the gate of NMOS transistor N6 to be turned on, so that an electric potential of the node E stays in the ground voltage state.

The feedback voltage generator is composed of two NMOS transistors N10 and N11 coupled in serial between an output terminal of the core voltage generated from the comparator and the ground voltage. Also coupled to a node F between the two transistors N10 and N11 is the gate of the transistor N2 of the comparator. The two transistors N10 and N11 are configured to have their gates coupled to their drains, respectively, so as to have diode characteristics. That is to say, the core voltage is divided by the two transistors N10 and N11 to obtain a divided core voltage, which turns on the transistor N2 of the comparator.

In the invention, the discharge unit is composed of NMOS transistors N7, N8, and N9, which are coupled to the core voltage output node VCORE, sources of which are coupled to the ground voltage, drains of which are coupled to the core voltage output terminal, and gates of which are controlled by an output signal from the discharge adjustor to be described later.

The NMOS transistors N7, N8, and N9 are configured to have different sizes, wherein their capacity are as: N8 having the largest capacity, N9 having the smallest capacity, and N7 having a medium capacity. The operation sates of the NMOS transistors N7, N8, and N9 are adjusted differently from each other depending on a potential of the external power supply voltage. That is, when the external power voltage is at a normal level, the transistor N7 is turned on to operate, and when the external power voltage is at a high level, the transistor N8 is turned on to operate. Meanwhile, when the external power voltage is at a low level, the transistor N9 is turned on to operate. In other words, the discharge transistors with different sizes operate depending on the level of the external power supply voltage, so that amounts of discharge are adjusted differently from each other.

The discharge adjustor of the invention includes a detector 40 for detecting the level of the external power supply voltage, an operation unit for adjusting operation states of the NMOS transistors N7, N8, and N9 depending on the level value detected by the detector 40. The operation unit is provided with a first logic circuit for driving the NMOS transistor N7 when the external power supply voltage has a normal potential, and a second logic circuit for driving the NMOS transistor N8 when the external power supply voltage has a high potential. In addition, it is further provided with a third logic circuit for driving the NMOS transistor N9 when the external power supply voltage has a low potential.

The first logic circuit is composed of a NOR gate 60 for performing a NOR operation on first and second outputs from the detector 40, a NAND gate 53 for executing a NAND operation on an output from the NOR gate 60 and an output of the node E, and an inverter 24 for inverting an output from the NAND gate 53 to apply an inverted output to a gate of the NMOS transistor N7. The second logic circuit is composed of a NAND gate 50 for performing a NAND operation on the first output from the detector 40 and the output of the node E, and an inverter 22 for inverting an output from the NAND 50 to provide an inverted output to a gate of the NMOS transistor N8. The third logic circuit is composed of a NAND gate 51 for carrying out a NAND operation on the second output from the detector 40 and the output of the node E, and an inverter 23 for inverting an output from the NAND 51 to apply an inverted output to a gate of the NMOS transistor N9.

Now, an operation of the internal voltage discharge circuit in accordance with invention having the configuration as above will be described in detail.

Figure 11:
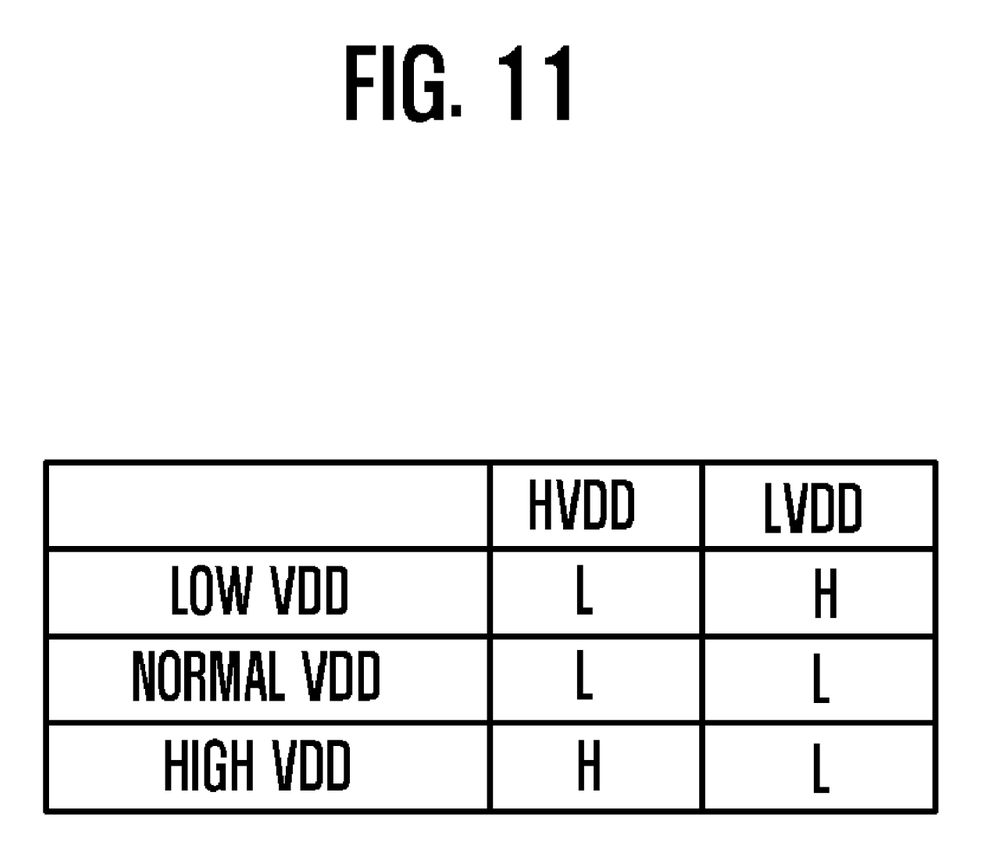
FIG. 11 is a state diagram showing states of signal outputs from the external power level detector in FIG. 10.

FIG. 11 is a state diagram showing states of signals outputted from the external power supply voltage detector shown in FIG. 10, depending on a potential of an external power supply voltage.

First, when a discharge circuit enable signal VCR_ON becomes a logic high level, the NMOS transistor N3 constituting the control switch is turned on to determine when the differential comparator will operate. Also, the discharge circuit enable signal VCR_ON is applied as a low signal to a gate of the transistor N6, which is turned off.

The differential comparator compares a feedback voltage HFVCORE having level of VCORE/2 voltage-divided by the transistors N10 and N11 having diode characteristics with a reference voltage VREFC. When there is a level rise at the core voltage end VCORE during the overdriving control process, the feedback voltage has a higher potential than the reference voltage. At this time, more current flows through the transistor N2, and thus an electric potential of a node B drops. The potential drop of the node B increases drive force of the PMOS transistor P4, so that an electric potential of the node E rises.

Meanwhile, the detector 40, which detects the level of the external power supply voltage, outputs a different signal depending on the detected level. That is, when the external power supply voltage is at a normal level, the detector 40 generates low signals as its first and second outputs HVDD and LVDD, respectively. And when the external power supply voltage is at a logic low level, the detector 40 generates a low signal as the first output and a high signal as the second output. On the contrary, when the external power supply voltage is at a logic high level, the detector 40 produces a high signal as the first output and a low signal as the second output.

Thus, when the external power supply voltage is at a normal level, the detector 40 generates low signals as its first and second outputs, respectively. The first and the second outputs are then provided to the NOR gate 60, which transits them to high signals. Next, the NAND gate 53 performs a NAND operation on the high signal from the detector 40 and the raised potential (high signal) of the node E to output a low signal. This low signal is inverted by the inverter 24 and then applied as a high signal to the gate of the discharge NMOS transistor N7.

Further, when the external power supply voltage is at a normal level, the NAND gate 50 executes a NAND operation on the low signal (first output) from the detector 40 and the raised potential (high signal) of the node E to output a high signal. This high signal is inverted by the inverter 22 and then provided as a low signal to the gate of the discharge NMOS transistor N8.

Also, when the external power supply voltage is at a normal level, the NAND gate 51 performs a NAND operation on the low signal (second output) from the detector 40 and the raised potential (high signal) of the node E to output a high signal. This high signal is inverted by the inverter 23 and then applied as a low signal to the gate of the discharge NMOS transistor N9.

Thus, when the external power supply voltage is at a normal level, the NMOS transistor N7 is turned on and the NMOS transistors N8 and N9 are turned off, based on the outputs from the detector 40. That is, the core voltage can be discharged under the control of the NMOS transistor N7 that is tuned on.

Next, when the external power supply voltage is at a high level, the detector 40 generates a high signal as a first output and a low signal as a second output. The first and the second outputs are then provided to the NOR gate 60, which transits them to low signals. And then, the NAND gate 53 performs a NAND operation on the low signal from the detector 40 and the raised potential (high signal) of the node E to output a high signal. This high signal is inverted by the inverter 24 and then applied as a low signal to the gate of the discharge NMOS transistor N7.

Further, when the external power supply voltage is at a high level, the NAND gate 50 executes a NAND operation on the low signal (first output) from the detector 40 and the raised potential (high signal) of the node E to output a low signal. The low signal is inverted by the inverter 22 and then applied as a high signal to the gate of the discharge NMOS transistor N8.

Also, when the external power supply voltage is at a high level, the NAND gate 51 performs a NAND operation on the low signal (second output) from the detector 40 and the raised potential (high signal) of the node E to output a high signal. The high signal is inverted by the inverter 23 and then applied as a low signal to the gate of the discharge NMOS transistor N9.

Thus, when the external power supply voltage is at a high level, the NMOS transistor N8 is turned on and the NMOS transistors N7 and N9 are turned off, based on the outputs from the detector 40. That is, the core voltage can be discharged under the control of the NMOS transistor N8 that is tuned on.

In other words, when the external power supply voltage is at a high level, the NMOS transistor N8 with the largest capacity is turned on based on the outputs from the detector 40, thereby controlling discharge of the core voltage.

On the contrary, when the external power supply voltage is at a low level, the detector 40 generates a low signal as a first output and a high signal as a second output. The first and the second outputs are then provided to the NOR gate 60, which transits them to low signals. Next, the NAND gate 53 performs a NAND operation on the low signal from the detector 40 and the raised potential (high signal) of the node E to output a high signal. The high signal is inverted by the inverter 24 and then applied as a low signal to the gate of the discharge NMOS transistor N7.

Further, when the external power supply voltage is at a low level, the NAND gate 50 performs a NAND operation on the low signal (first output) from the detector 40 and the raised potential (high signal) of the node E to output a high signal. The high signal is inverted by the inverter 22 and then applied as a low signal to the gate of the discharge NMOS transistor N8.

Also, when the external power supply voltage is at a logic low level, the NAND gate 51 executes a NAND operation on the high signal (second output) from the detector 40 and the raised potential (high signal) of the node E to output a low signal. The low signal is inverted by the inverter 23 and then applied as a high signal to the gate of the discharge NMOS transistor N9.

Thus, when the external power supply voltage is at a low level, the NMOS transistor N9 is turned on and the NMOS transistors N7 and N8 are turned off, based on the outputs from the detector 40. That is, the core voltage can be discharged under the control of the NMOS transistor N8 that is tuned on.

In other words, when the external power supply voltage is at a low level, the NMOS transistor N9 is turned off depending on the outputs from the detector 40 and thus discharge of the core voltage can be controlled. Accordingly, the core voltage is less discharged, compared to when the external power supply voltage is at a normal level, so that a target core voltage level can be stably kept even at a low level of the external power supply voltage, without any reduction in the core voltage level by its discharge.

As noted above, the invention can effectively control discharge of the core voltage by using discharge transistors with different sizes and by controlling those transistors to have different capacities depending on a level of an external power supply voltage. In particular, the invention allows an amount of current being discharged to vary, as being variations in an amount of inflowing current during an overdriving control process depending on a level of an external power supply voltage.

As a result, the invention detects a potential of external power supply voltage and controls operations of discharge transistors to operate in different manner depending on the detected potential. Thus, when the external power supply voltage is at a high level, the invention can stably control a core voltage by discharging a relatively larger amount than at a normal level against a large amount of inflowing current to a core voltage end that may occur during an overdriving control process.

In addition, when the external power supply voltage is at a low level, the invention can control a core voltage to be kept at a target level by discharging a relatively less amount than at a normal level. Accordingly, the invention can efficiently control an amount of discharge depending on a potential of the external power supply voltage, so that the core voltage can be stably kept at a target level.

While the invention has been described with respect to the specific embodiments, it will be apparent to those skilled in the art that various changes and modifications may be made without departing from the spirit and scope of the invention as defined in the following claims.

What is claimed is:

1. An internal voltage discharge circuit, comprising:
    a differential comparator configured to differently compare a reference voltage with a feedback voltage to generate a discharge control voltage;
    a level detector configured to detect a level of external power supply voltage; and
    a discharge unit configured to adjust an amount of discharge of an internal voltage based on the level signal detected by the level detector and the discharge control voltage generated by the differential comparator.

2. The internal voltage circuit a recited in claim 1, wherein the discharge unit includes
    a first discharger configured to control discharge of the internal voltage depending on the discharge control voltage generated by the differential comparator,
    a second discharger configured to control discharge of the internal voltage based on a first output of the level detector when the external power supply voltage is at a normal level, and
    a third discharger configured to control discharge of the internal voltage based on a second output of the level detector when the external power supply voltage is at a high level.

3. The internal voltage discharge circuit as recited in claim 2, wherein the discharge unit further includes a discharge adjustor for logically operating on the first and the second outputs of the level detector to control the operation of the second and the third dischargers.

4. The internal voltage discharge circuit as recited in claim 3, wherein the first, the second, and the third dischargers in the discharge unit have the same discharge capacities.

5. The internal voltage discharge as recited in claim 4, wherein the discharge unit drives only the first discharger when the external power supply voltage is at a low level.

6. The internal voltage discharge circuit as recited in claim 5, wherein the discharge unit drives the first and the second dischargers when the external power supply voltage is at a normal level.

7. The internal voltage discharge circuit as recited in claim 6, wherein the discharge unit drives the first, the second, and the third discharger when the external power supply voltage is at high level.

8. The internal voltage discharge circuit as recited in claim 3, wherein the discharge adjustor includes a first logic circuit configured to logically operate on the first output of the level detector and the discharge control voltage; and
a second logic circuit configured to logically operate on the second output of the level detector and the discharge control voltage.

9. The internal voltage discharge circuit as recited in claim 8, wherein each of the first and the second logic circuits is composed of a NAND gate and an inverter.

10. The internal voltage discharge circuit as recited in claim 1, wherein the differential comparator is driven for a predetermined time period at the time the internal voltage is changed from the external power supply voltage to a core voltage.

11. The internal voltage discharge circuit as recited in claim 10, wherein the differential comparator further includes a control switch configured to establish a current path to control the operation of the differential comparator for the predetermined time period, and a mute unit configured to mute the output from the differential comparator when the predetermined time period expires.

12. The internal voltage discharge circuit as recited in claim 7, wherein the discharge unit is composed of a transistor.

13. An internal voltage discharge circuit, comprising:
a differential comparator configured to differently compare a reference voltage with a feedback voltage to generate a discharge control voltage;
a level detector configured to detect a level of external power supply voltage;
a discharge unit configured to control discharge of an internal voltage; and
a discharge adjustor configured to adjust an amount of discharge of the discharge unit based on the level signal detected by the level detector and the discharge control voltage from the differential comparator.

14. The internal voltage discharge circuit as recited in claim 13, wherein the discharge unit is composed of a plurality discharge devices coupled in parallel between an internal voltage output terminal and a ground voltage.

15. The internal voltage discharge circuit as recited in claim 14, wherein the discharge devices are composed of NMOS transistors of different capacities.

16. The internal voltage discharge circuit as recited in claim 15, wherein the discharge adjustor drives the transistor with the largest capacity when the external power supply voltage detected by the level detector is at a low level.

17. The internal voltage discharge circuit as recited in claim 15, wherein the NMOS transistors of different capabilities include an NMOS transistor of a relative low capacity, an NMOS transistor of a relative high capacity and a medium capacity NMOS transistor whose capacity is between that of the high capacity transistor and that of the lower capacity transistor, and the discharge adjustor drives the transistor with the medium capacity when the external power supply voltage detected by the level detector is at a normal level.

18. The internal voltage discharge circuit as recited in claim 15, wherein the discharge adjustor drives the transistor with the smallest capacity when the external power supply voltage detected by the level detector is at a logic low level.

19. A control method of an internal voltage discharge circuit, comprising:
differently comparing a reference voltage with a feedback voltage for a preset time period, to generate a discharge control voltage;
detecting a level of an external power supply voltage;
controlling an amount of discharge of an internal voltage to be relatively large, based on the discharge control voltage when the external power supply voltage detected by the level detector is at a high level;
controlling an amount of discharge of the internal voltage to be relatively small, based on the discharge control voltage when the external power supply voltage detected by the level detector is at a low level; and
controlling an amount of discharge of the internal voltage to be a medium amount based on the discharge control voltage when the external power supply voltage detected by the level detector is at a normal level.

20. The control method as recited in claim 19, wherein the differentially comparing step is driven for a preset time period at the time the internal voltage is changed from the external power supply voltage to a core voltage.

21. The control method as recited in claim 20, wherein the controlling steps control discharge devices being driven by making their capacities different from one another.

22. The control method as recited in claim 20, wherein the controlling steps control discharge devices being driven by adjusting their number.

* * * * *